United States Patent [19]
Eggermont

[11] 3,988,606
[45] Oct. 26, 1976

[54] DIGITAL FILTER DEVICE FOR PROCESSING BINARY-CODED SIGNAL SAMPLES

[75] Inventor: Ludwig Desire Johan Eggermont, Eindhoven, Netherlands

[73] Assignee: U.S. Philips Corporation, New York, N.Y.

[22] Filed: May 30, 1975

[21] Appl. No.: 582,309

[30] Foreign Application Priority Data
June 17, 1974 Netherlands ..................... 7408032

[52] U.S. Cl. ................................ 235/156; 325/42; 328/167
[51] Int. Cl.² ......................................... G06F 15/34
[58] Field of Search ............ 235/156, 152; 328/167; 333/18, 28, 70 T; 325/42, 38 B

[56] References Cited
UNITED STATES PATENTS

| | | |
|---|---|---|
| 3,557,354 | 1/1971 | Trimble ............................. 235/152 |
| 3,639,848 | 2/1972 | Elliot ................................ 328/167 |
| 3,732,409 | 5/1973 | Fletcher ......................... 235/152 X |
| 3,814,917 | 6/1974 | Nussbaumer ...................... 235/152 |

*Primary Examiner*—Joseph F. Ruggiero
*Attorney, Agent, or Firm*—Frank R. Trifari; Daniel R. McGlynn

[57] ABSTRACT

A digital filter is described in which the filter coefficients which differ from zero are coded in unequal numbers of multipliers which are equal to $2^n$ and in which immediately after each multiplication of a given signal sample by the multipliers of the relevant filter coefficient a new signal sample is processed in the multiplying devices by the relevant multipliers. Thus the signal samples are applied to the multiplying device at instants which are mutually set independently of one another.

10 Claims, 6 Drawing Figures

DIGITAL FILTER DEVICE FOR PROCESSING BINARY-CODED SIGNAL SAMPLES

BACKGROUND OF THE INVENTION

1. Scope of the invention

The invention relates to a digital filter device to which a digital signal is applied which is transformed into a digital output signal in a predetermined manner. Such a filter device may be intended to limit the frequency band of the input signal and may be designed so as to form, for example, a low-pass filter, a band-pass filter or a band-stop filter, or a high-pass filter. The said digital filter devices can in general be divided into two classes which denote the manner of realizing the filter, viz. recursive filters and non-recursive filters. Hereinafter instead of the term "digital filter device" the term "digital filter" will be used.

2. Description of the state of the art

The digital signal which is applied to the digital filter in general is constituted by a sequence of binary-coded numbers which hereinafter will be represented by $x(nT)$. These binary-coded numbers which each comprise a plurality of binary digits (bits) in general represent samples of an analog information signal. These numbers are obtained by sampling the analog information signal in the usual manner at a fixed sampling frequency $1/T$ and quantizing the resulting time-discrete signal values and representing them in a binary code. In this connection the term "time-discrete" means that signal samples are taken at discrete instants $nT$, where $n = 0, 1, 2, \ldots$ represents the number of samples which have been taken after the instant $t = 0$, which samplings occur with a sampling period $T$.

The transformation of these binary-coded numbers $x(nT)$ in the digital filter consists in that they are subjected to a predetermined sequence of arithmetic operations, resulting in binary-coded numbers which are delivered by the filter as digital output signals. If, as frequently is the case, after insertion of a binary-coded number $x(nT)$ the filter delivers only one single binary-coded output number, these output numbers of the filter can be represented by $y(nT)$.

If the filter is arranged, for example, to limit the frequency band of the analog information signal, for a recursive digital filter the operation to be performed can mathematically be represented by:

$$y(nT) = \sum_{k=0}^{N} a_k x[(n-k)T] - \sum_{k=1}^{M} b_k y[(n-k)T] \quad (1)$$

and for a non-recursive digital filter by:

$$y(nT) = \sum_{k=N_1}^{N_2} h(kT) x[(n-k)T] \quad (2)$$

In these expressions the likewise binary-coded numbers $a_k$, $b_k$ and $h(kT)$ are referred to as filter coefficients, and these coefficients are determined by the transfer function of the filter. The number $h(kT)$ more particularly represent the binary-coded samples of the impulse response of the digital filter, which impulse response is also sampled at a frequency of $1/T$.

It should be mentioned that the expression (1) represents a recursive digital filter of the $Mth$ order and that the non-recursive filter represented by the expression (2) belongs in the class of FIR (finite impulse response) filters.

For performing the operations given by the expressions (1) and (2) on the numbers $x(nT)$ the digital filter in general includes storing means in which the successively occurring numbers $x(nT)$ are stored. This storing means may, for example, be in the form of a shift register into each shift register element of which a number $x(nT)$ can be stored. The filter further includes a multiplying device to which the stored numbers $x(nT)$ and the respective filter coefficients $a_k$ and $h(kT)$ are supplied for forming binary-coded numbers which represent the various products $a_k x(n-k)T$ and $h(kT) \cdot x[(n-k)T]$. These products are supplied to an adding-device in which they are added to one another. As follows from expression (1), for the recursive digital filter this operation is also and identically performed on a given number of M output numbers $y[(n-k)T]$ which immediately precede the output number $y(nT)$ to be determined.

A usual method of performing a multiplication, for example $h(kT) \cdot x[(n-k)T]$, consists in that each time one bit of the coefficient $h(kT)$ is multiplied by the multiplicand $x[(n-k)T]$. The obtained partial products, which are equal either to zero or to the multiplicand, are accumulated in an accumulator after being shifted a number of places equal to the magnitude of the exponent of the relevant bit of the coefficent.

If generating a partial product in conjunction with adding the shifted partial product in the accumulator is defined to as an elementary operation, the number of elementary operations for performing a complete multiplication is equal to the number of bits of the filter coefficient (for example $h(kT)$) increased by one. Each of these elementary operations is performed under the control of a clock pulse generator which for this purpose generates clock pulses at a frequency $f_p$ which is proportional both to the sampling frequency $1/T$ and to the number of bits of which each filter coefficient consists. If, for example, the expression (2) is realized by serial processing, this frequency $f_p$ is also proportional to the number of input numbers $x(nT)$ required to determine an output number $y(nT)$.

Because the components used set a limit to the maximum value of the said frequency $f_p$, a limit is set to the number of bits from which the numbers $x(nT)$, $y(nT)$, $a_k$, $b_k$, $h(kT)$ are built up and, in the case of serial performance of expression (2), also to the number of numbers $x(nT)$ which can be taken into consideration for determining an output number $y(nT)$.

However, it is just the aforementioned factors which determine the accuracy with which a desired transfer characteristic can be realized.

It is an object of the present invention to provide a digital filter which enables the frequency $f_p$ of the clock pulse generator to be considerably reduced and which is highly flexible and capable of universal application.

SUMMARY OF THE INVENTION

A digital filter device for processing binary-coded signal samples for generating a sequence of output samples which occur with a given sampling period T and which each at least are formed by the sum of a plurality of the said signal samples which each have been multiplied by a given filter coefficient, which filter device comprises first storing means for storing the said plurality of signal samples, a multiplying device for multiplying a signal sample by the relevant filter coefficient, a control device coupled to the said first storage device and to the said multiplying device, according to the invention is characterized in that every filter coefficient which is not equal to zero comprises a plurality of multipliers which each have a value which is exactly equal to $2^n$, where 2 is the base of the binary scale of rotation and $n$ is an integer, while the number of the multipliers of at least one filter coefficient is different from that of at least one other filter coefficient, and in a sampling period T of the output samples the said control device supplies a signal sample stored in the said first storing means a number of times to the said multiplying device, the said number of times being equal to the number of multipliers of the filter coefficient associated with the relevant signal sample.

The important advantage of the invention is that the bits of the filter coefficients ($a_k$, $b_k$ $h(kT)$ ) are not successively examined by scanning these coefficients and that a radix point translation device can be used as multiplying device. This radix point translation device, which is described in particular in the book "Arithmetic operations in digital computers" mentioned hereinafter under the heading "References," when performing a multiplication moreover does not pass cyclically through all its possible moving positions but for a given value of a filter coefficient it is set by the relevant code words of the first source to a number of positions which corresponds to the number of multipliers of the said filter coefficient. Each setting of the radix point translation device thus effects a change of the contents of the accumulator. More particularly, there is no setting of the radix point translation device which corresponds to a multiplication of a signal sample by a factor of zero and hence does not effect a change of the contents of the accumulator.

The number of times the radix point translation device is set for one signal sample is different from sample to sample and is given by the number of multipliers of the relevant filter coefficient. This number of times may be made considerably smaller than the number of 1 bits in the filter coefficients by which a given signal sample is to be multiplied. A reduction of the number of settings of the radix point translation device per signal sample is obtainable, for example, by previously encoding the known filter coefficients according to the theory of "Rapid Multiplications."

REFERENCES a. For the terminology used reference is made to: "Terminology in digital signal processing" in IEEE Transactions on Audio and Electroacoustics, Vol. AU-20, No. 5, December 1972.

b. For a general survey of digital filters we refer to: "Digital processing of signals" by B. Gold and C. M. Rader, Mc. Graw-Hill Book Company 1969.

c. For a general view of multiplying two binary-coded numbers we refer to: "Arithmetic operations in digital computers," by R. K. Richards, D. van Nostrand Company, Inc. 1957, in particular Chapter 5.

d. We further refer to: "Digital Computer and Control Engineering," by R. S. Ledley, Mc. Graw-Hill Book Company, 1960.

DESCRIPTION OF THE DIGITAL FILTER DEVICE

THE DEVICE IN GENERAL

Figure 1:
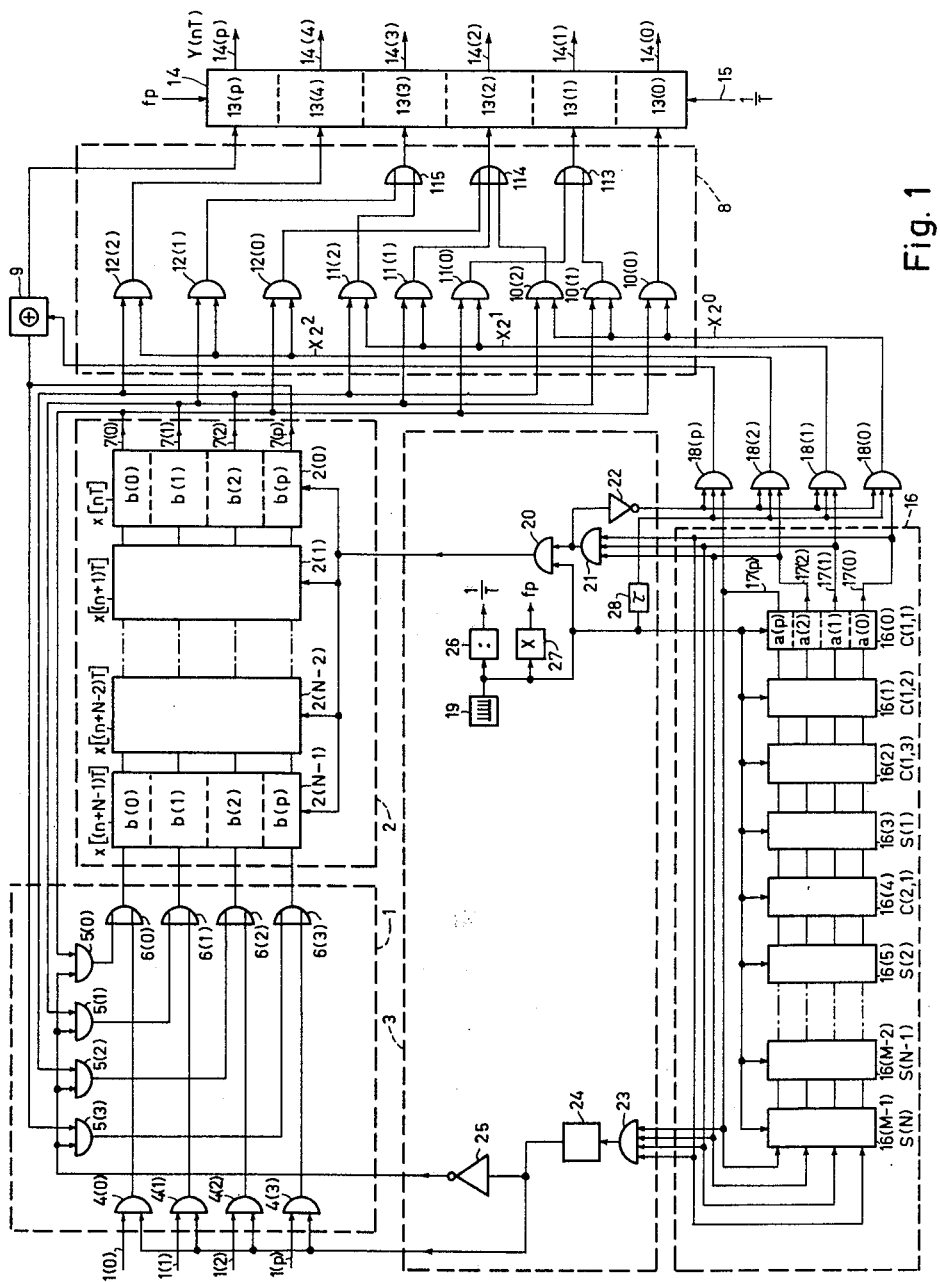
FIG. 1 is a schematic diagram of a non-recursive digital filter according to the invention.

The non-recursive digital filter shown in FIG. 1 is arranged to limit the frequency band occupied by an information signal $x(t)$. For this purpose the said information signal is converted in a usual manner into binary-coded signal samples $x(nT)$ which hereinafter will be referred to as "numbers." In this non-recursive digital filter the said input numbers $x(nT)$ are processed according to the expression (2). That is to say they are subjected to convolution with the sequence of numbers $h(kT)$ which characterize samplings of the impulse response of the filter, which samplings occur at a frequency 1/T.

In the embodiment shown the numbers $x(nT)$ consist of 4 bits of which three characterize the magnitude and one the sign of the signal samples $x(nT)$. These bits occur in parallel, i.e., simultaneously but on different leads. More particularly these bits are applied to the filter via input leads 1(0), 1(1), 1(2) and 1($p$). The bit which occurs on the lead 1(0) has the value $2^0$, the bit on the lead 1(1) has the value $2^1$, the bit on the lead 1(2) has the value $2^2$ and the bit on the lead 1($p$) denotes the sign of the number $x(nT)$.

The numbers $x(nT)$ are written via an input circuit 1 in a store 2 which here is in the form of a cascade arrangement of N storage elements 2(0), 2(1), . . . , 2(N − 2), 2(N − 1). Each of these storage elements is arranged to store a number $x(nT)$ and to shift a stored number to a succeeding storage element. In the store shown the bits of the numbers $x(nT)$ are stored and shifted in parallel. In the Figure this parallel storage is indicated for the elements 2(0) and 2(N − 1) by means of the symbols $b(0)$, $b(1)$, $b(2)$, $b(p)$, where $b(0)$ denotes the place of that bit of $x(nT)$ which has the value $2^0$, $b(1)$ which has the value $2^1$, $b(2)$ the place of that bit of $x(nT)$ which has the value $2^2$ and $b(p)$ the place of the sign bit of $x(nT)$.

Shifting a number stored in a storage element to the next succeeding storage element is effected under the control of a control circuit 3 to be described hereinafter.

The storage device 2 is of the circulating type and for this purpose the outputs of the final storage element 2(0) of the store 2 are fed back via the input circuit 1 to the inputs of the first storage element 2(N − 1).

The input circuit 1 is constituted in the manner shown in the Figure by input AND gates 4(0) to 4(3), feedback AND gates 5(0) to 5(3) and OR gates 6(0) to 6(3). The AND gates 4(0) to 4(3) and the AND gates 5(0) to 5(3) are controlled respectively by control signals which are the logical inverse of one another and are derived from the control circuit 3.

If a logic 1 is applied to the inputs of the AND-gates 4(.), a new number $x(nT)$ can be written in the storage element 2(N-1). If a logic 1 is applied to the inputs of the AND gates 5(.), these gates are opened and the AND gates 4(.) are closed. At this stage of operation the control circuit 3 applies to the store 2 a number of shift pulses such that all the numbers stored in it are shifted around once.

For performing the operation shown by the expression (2) the number stored in the storage element 2(0) is multiplied by a filter coefficient. For this purpose the magnitude bits $b(0)$, $b(1)$, $b(2)$ of this number $x(nT)$ are applied via output leads 7(0), 7(1), 7(2) respectively to a radix point translation device 8. The sign bit $b(p)$ is applied to a modulo-2 gate 9 via an output lead 7($p$).

In the embodiment shown this radix point translation device 8 is in the form of a switching device which frequently is referred to as a "shifter". This shifter is built up in the manner shown in the Figure from three sets of AND gates, 10(0) to 10(2), 11(0) to 11(2) and 12(0) to 12(2), and from OR gates 113, 114, 115. To each of the sets of AND gates 10(.), 11(.) and 12(.) the three magnitude bits $b(0)$, $b(1)$ and $b(2)$ of the number in the storage element 2(0) are applied. The shifter further has five outputs 13(0) to 13(4) each connected to an input of an accumulator 14. The accumulator further comprises an addition subtraction input 13($p$) to which the output signal of the modulo-2 gate 9 is applied. If now a logic 1 appears at the output of the modulo-2 gate 9, a number supplied to the accumulator 14 is subtracted from the contents of the accumulator, but when a logic 0 appears at the output of the gate 9 an addition is performed in the accumulator. The accumulator also has a read-out instruction input 15 via which read-out instruction pulses are applied to the accumulator at a frequency 1/T. On the occurrence of such an instruction pulse the contents of the accumulator are read out and can be transferred as the output code word $y(nT)$ or can be subjected to a further operation. It should be mentioned that addition of a number to, and subtraction of a number from the contents of the accumulator is effected in known manner under the control of clock pulses which occur at the aforementioned frequency $f_p$. In the embodiment shown, in which due to the multiplications performed the numbers $y(nT)$ each comprise five magnitude bits and one sign bit, these bits appear at the outputs 14(0), to 14(4) and 14($p$) respectively. After the contents of the accumulator have been read it is reset.

The shifter 8 is controlled by code words in the form of binary-coded numbers which characterize the required filter coefficient $h(kT)$. More particularly in this embodiment these code words are the aforementioned multipliers which each also comprise four bits of which three represent the magnitude and one the sign. Only one of the three magnitude bits has the logic value 1. By each of these multipliers a number which appears on the leads 7(0) to 7(2) of the storage element 2(0) is transmitted to given successive output leads of the set of output leads 13(.) of the shifter 8, which output leads are characteristic of the relevant multiplier. The code words or multipliers are delivered in cyclic sequence by a source 16 which is controlled by the control circuit 3.

In the embodiment shown this source 16 is constituted similarly to the storage device 2 by a circulating storage device having M storage elements 16(0) to 16(M − 1) each arranged to store 4-bit code words. Similarly to what is the case for the numbers $x(nT)$ the bits of the code words also are stored and shifted in parallel in the storage elements 16(.). This parallel storage is shown in The Figure for the element 16(0) by symbols $a(0)$, $a(1)$, $a(2)$, $a(p)$. Here also $a(0)$, $a(1)$, $a(2)$ indicate the position of the bit in the code word of value $2^0$, $2^1$, $2^2$ respectively and $a(p)$ indicates the position of the sign bit.

In the circulating store 16 also the outputs 17(.) of the final storage element 16(0) are fed back to the inputs of the first storage element 16(M-1), however, no new code words are written in this store.

The outputs 17(0), 17(1), 17(2) of the element 16(0) are connected via AND gates 18(0), 18(1), 18(2) respectively to inputs of the shifter 8. More particularly the output of the AND gate 18(0) is connected to an input of each of the AND gates 10(.), the output of the AND gate 18(1) to an input of each of the AND gates 11(.), and the output of the AND gate 18(2) to an input of each of the AND gates 12(.).

The sign bit $a(p)$ is applied via an AND gate 18($p$) to a second input of the modulo-2 gate 9. As a result, this gate 9 delivers a logic 1 if the sign of the signal sample in the storage element 2(0) is not equal to the sign of the code word in the storage element 16(0), and a logic 0 if the said polarities are equal. The AND gates 18(.) also are controlled by control signals derived from the control circuit 3.

OPERATION OF THE RADIX POINT TRANSLATION DEVICE

If the bits of the number $x(nT)$ stored in the storage element 2(0) which appear on the leads 7(0), . . . , 7(2) are given by 110 and the code word which is delivered by the circulating store 16 and controls the shifter 8 is given in magnitude by the binary number 100, where 1 occupies the position of the least significant bit, the number 110 is transmitted via the AND gates 10(.) to the outputs 13(0) - 13(2), which means multiplication of the number 110 by a factor of $2^0 = 1$. The bits which occur at the outputs 13(0) to 13(4) are 1,1,0,0,0 respectively. The resulting 5-bit number is added to, or subtracted from, the contents of the accumulator. If the code word is the binary number 010, which corresponds to the decimal number $2^1$, the number 110 is transferred through the AND gates 11(.) to the outputs 13(1) to 13(3). The bits which now appear at the outputs 13(0) to 13(4) are 0, 1, 1, 0, 0 respectively, which shows that the number 110 has been multiplied by a factor of $2^1$. This number 01100, which also may be written as 0.01100, the constituent bits increasing in significance from left to right, can be considered as to originate from the number 00.1100 in which also the bits increase in significance from left to right, by moving the point to the left a number of bit placers determined by the exponent of that power of two to which the position of the 1 bit corresponds in the binary number 010 by which the number 110 has been multiplied.

If the code word $a(0)$, $a(1)$, $a(2)$ now is given by the number 001, which corresponds to the decimal number $2^2$, the number 110 is transferred through the AND gates 12(.) to the outputs 13(2) to 13(4) of the shifter 8, so that at the outputs 13(0) to 13(4) of the shifter the bits 0, 0, 1, 1, 0 respectively appear. Thus the number 0.00110 is supplied to the accumulator, which number now may be regarded as being produced from the number 110 by multiplication thereof by a factor of $2^2$, and here also multiplication is performed by moving the point of the number 00.110 two bit places to the left.

ENCODING THE FILTER COEFFICIENTS

In order to multiply a number $x(nT)$ by an arbitrary number $h(kT)$, this number $h(kT)$ is encoded in a minimum number of code words which each have a value exactly equal to $2^m$, where $m$ is an integer. It will be assumed, for example, that $h(kT)$ is given by the binary-coded number 011, the constituent bits increasing in significance from left to right. A first form of encoding the filter coefficients consists in that a filter coefficient is converted into code words which each contain at most one 1 bit. For the coefficient 011 this means that it is converted into the multipliers 000, 010, 001 which represent the decimal values 0, $2^1$, $2^2$ respectively.

Because the filter coefficients $h(kT)$ are known, for they determine the transfer characteristic of the filter, the number of elementary operations defined hereinbefore can be greatly reduced. For this purpose only those code words are stored as multipliers in the store 16 one of the bits of which has the logic value 1. In the above example they are the multipliers 010 and 001. Each of these multipliers is distinguished from the multiplier 000 in that after the occurrence of one of them with a signal sample different from zero the contents of the accumulator change. Thus for the 0 bits which occur in the filter coefficient no time is reserved for adding a partial product consisting of five 0 bits to the contents of the accumulator and also no time is reserved for setting the shifter in accordance with the position of the 0 bit in the filter coefficient.

In particular when using filter coefficients which each comprise a large number of bits a considerable reduction of the number of elementary operations is obtainable by encoding the filter coefficients according to a second method, i.e., the method according to the theory of "Rapid Multiplication." This method consists in that groups of similar bits in a number are combined. For the number 0111 ($= 2^1 + 2^2 + 2^3$) for example this means that the number can be written as the algebraic sum of two powers of two, for example $2^4 - 2^1$. The code words which characterize these two powers of two are: 01000 ($= -2^1$) and +00001 ($= +2^4$). Only these two code words are stored as multipliers in the store 16 and they may, for example, be read out in this order. In this process the shifter switches directly from the setting which corresponds to the multiplier 10000 to the setting which corresponds to the multiplier 00001.

If the number of bits of a filter coefficient appreciably exceeds the number of bits which can be stored in a storage element of the store 16, a third encoding method can be used. If, for example, the filter coefficient is given by the number 01111, this can be written as: $7 \times 2^2 + 2^1$, the code words +001 and +010 and the multiplicative constant "seven" characterizing the filter coefficient $h(kT)$. In this case the code word +010 is stored as a multiplier in a storage element of the store 16 while the code word +001 is stored in each of the seven succeeding storage elements.

As will be seen from the above, any filter coefficient can so be encoded in a number of code words which act as multipliers that with a given storage capacity of the store 16 a minimum number of settings of the setting device and a minimum number of addition or subtraction operations are obtained, while in particular at each setting of the shifter a change of the content's of the accumulator 14 is effected if the signal sample is not equal to zero.

STORAGE OF THE CODE WORDS IN THE CIRCULATING COEFFICIENT STORE.

In the embodiment shown in FIG. 1 the storage elements 16(.) are constructed to store multipliers which each contain only three magnitude bits and are obtained by encoding the filter coefficients by the aforedescribed first method. If in particular the filter coefficient is given in magnitude by the number 100 (decimal 1), this number is directly stored in the storage element $16(i)$. If the filter coefficient is given by the number 110 (decimal 3), multipliers 100 and 010 are stored in successive storage elements 16 $(i)$ and $16(i + 1)$. If however the filter coefficient is given by the number 111 (decimal 7), multipliers 100, 010, 001 are stored in successive storage elements $16(i)$, $16(i+1)$, $16(i+2)$ respectively. This again shows that in this form of encoding different filter coefficients are represented by unequal numbers of multipliers.

In order to optimize utilization of the available internal processing time an auxiliary code word is generated after every occurrence of those multipliers which together characterize a given filter coefficient. In the embodiment described it will be assumed that these auxiliary code words all are equal to the binary number 1110, the 0 bit occupying the position of the sign bit. These auxiliary code words and the multipliers together are so stored in the store 16 that any two storage elements which contain multipliers associated with different filter coefficients are separated by a storage element in which such an auxiliary code word is stored. As is shown schematically in the Figure, the storage elements 16(0) to 16(2) for example contain the multipliers $c(1,1)$, $c(1,2)$ and $c(1,3)$ respectively for the filter coefficient $c(1)$, while the element 16(3) contains the first auxiliary code word $S(1)$. Thus the element 16(4) contains the multiplier $c(2,1)$, which is identical with the filter coefficient $c(2)$, and the element 16(5) contains the second auxiliary code word $S(2)$. Thus the auxiliary code words $S(1)$ and $S(2)$ each indicate the end of a successive sequence of multipliers, which sequences each characterize a given filter coefficient and, as has been mentioned hereinbefore, in general contain different numbers of multipliers.

For reasons to be given hereinafter the auxiliary code word $S(N - 1)$ which occurs after the multipliers which characterize the final filter coefficient $h(kT)$ is immediately followed by an auxiliary code word $S(N)$. This auxiliary code word $S(N)$ indicates the end of the sequence of filter coefficients. The constituent bits $a(0)$, $a(1)$, $a(2)$, $a(p)$ of this auxiliary code word $S(N)$ may be selected so that it is distinguished from the other auxiliary code words $S(1)$ to $S(N - 1)$. Whereas the latter auxiliary code words are all represented by the number 1110, the auxiliary code word $S(N)$ will now be represented, for example, by the number 1111, the sign bit $a(p)$ also now having the value 1.

THE CONTROL CIRCUIT

The control circuit 3 includes a central clock pulse generator 19 which produces periodic clock pulses at a frequency M/T. M is the number of storage elements in the store 16 and 1/T is the sampling frequency of the analog information signal $x(t)$. The clock pulses are directly applied to the store 16, causing the contents thereof to be circulated at the frequency M/T so that after each clock pulse a new multiplier $c(k, i)$ or code word $S(j)$ appears at the outputs 17(.) of the store 16.

The clock pulses are also applied to the store 2 through a normally closed AND gate 20. To this AND gate 20 are also applied the output pulses from an AND gate 21 having three inputs which are connected each to one of the output leads 17(0) to 17(2) of the storage element 16(0). When thus due to the shifting of the contents of the store 16 an auxiliary code word $S(i)$ (=1110) is written in the element 16(0), the AND gate 21 delivers an output pulse. This output pulse via an inverter 22 closes the AND gates 18(.) so that this auxiliary code word is not supplied as a multiplier to the shifter 8. On the other hand, the said output pulse opens the AND gate 20 so that one clock pulse from the generator 19 is applied to the store 2 with the result that the contents of the elements 2(.) are shifted one store location and another number $x(nT)$ is stored in the element 2(0). This number $x(nT)$ remains in the element 2(0) until another auxiliary code word $S(i)$ is written in the storage element 16(0), whereupon the number $x(nT)$ is written in the element 2(N - 1).

The multipliers $c(i+.1, k)$ which occur between each two auxiliary code words $S(i)$ and $S(i + 1)$ control the setting of the shifter 8, so that each number $x(nT)$ when stored in the storage element 2(0) is applied to the shifter 8 several times and each time is multiplied by a number which is exactly equal to an integral power of two.

After the occurrence of the auxiliary code word $S(N - 1)$ at the output 17(.) of the element 16(0) the contents of the storage elements 2(.) again is exactly equal to the contents these elements had immediately after a signal sample $x(nT)$ applied to the filter had been written in the store 2.

In order to enable a signal sample applied to the filter to be written in the storage element 2(N - 1) via the normally closed AND gates 4(0) to 4(3), in the embodiment shown the outputs 17(.) of the element 16(0) are connected to inputs of an AND gate 23 which passes a pulse each time the auxiliary code word $S(N)$ (=1111) is written in the storage element 16(0). This auxiliary code word $S(N)$ also causes the contents of the storage elements 2(.) to be shifted one place so that the oldest signal sample disappears from the store 2 simultaneously with a new signal sample being written in the storage element 2(N - 1).

More particularly this writing of a new signal sample in the element 2(N - 1) is effected in that the output pulse from the AND gate 23 triggers a monostable multivibrator 24. The output pulse from the multivibrator 24 opens the AND gates 4(.) and through an inverter 25 closes the normally open AND gates 5(.).

In the control circuit 3 the clock pulse generator 19 is also connected to a frequency divider 26 for producing read pulses for the accumulator 14 which occur at the frequency 1/T. The generator 19 is further connected to a frequency multiplier 27 for producing control pulses which occur at a frequency $f_p$ and control the adding and subtracting operations of the accumulator. In this embodiment the clock pulses from the generator 19 also control the AND gates 18(.). However, the clock pulses applied to the AND gates 18(.) are delayed a short time relative to the clock pulses which are applied to the storage elements 16(.). This short delay time is obtained by means of a delay element 28 which is connected to the output of the generator 19 in the manner shown in the Figure.

MODIFICATION OF THE INVENTION

Figure 2:
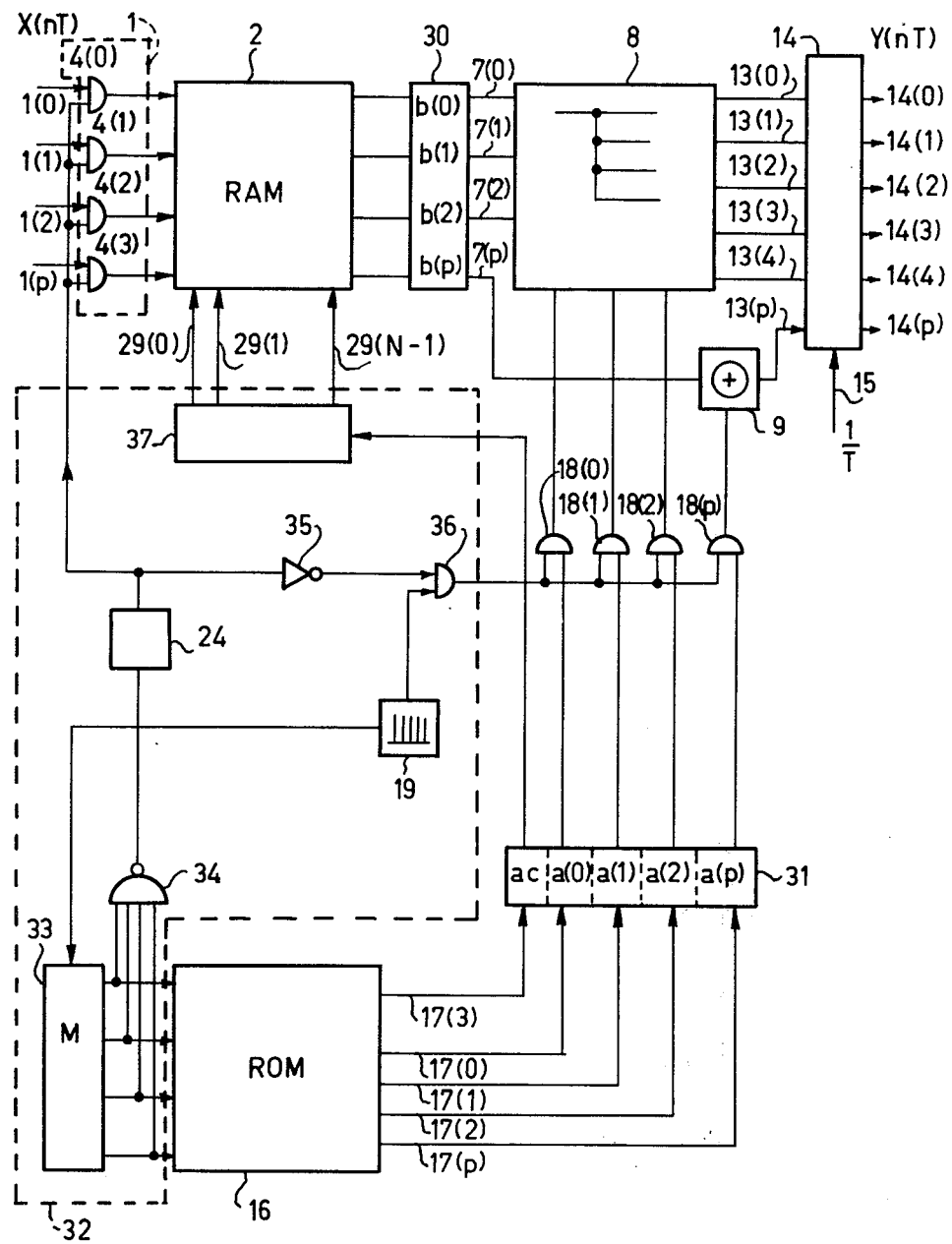
FIGS. 2 and 3 show modifications of the filter of FIG. 1.

A modified embodiment of the non-recursive digital filter of FIG. 1 is shown in FIG. 2. In FIG. 2 elements which correspond to elements of FIG. 1 are designated by the same reference symbols. The non-recursive digital filter shown in FIG. 2 also has an input circuit 1 to which digitally coded signal samples $x(nT)$ are supplied at a frequency 1/T. In this embodiment the input circuit comprises the AND gates 4(.) only. Through the input circuit the numbers $x(nT)$ are written in the store 2 which in this embodiment is in the form of a random access memory (RAM). More particularly, a number $x(nT)$ is written in this RAM at a location which is determined by an address code in the form of a multibit binary number which is applied in parallel through inputs 29(.) to the RAM. As is usual in a RAM such an address code also results in that the number $x(nT)$ which is stored at the location determined by the address code appears at the output of the RAM. In the embodiment shown such a number which appears at the output of the RAM is written in a storage element 30. Storage is again effected with parallel bits, and the meanings of the indices (0), (1), (2), .(p) shown in the Figure are the same as in FIG. 1. Here also the number stored in the element 30 is applied to the accumulator 14 via the shifter 8.

The multipliers derived from the filter coefficients by means of the aforedescribed encoding methods again are stored in the store 16, which in this embodiment is in the form of a read only memory (ROM). In this ROM also M numbers are stored, i.e., N encoded filter coefficients and N auxiliary code words, while a number can be read out by means of an address code which characterises the location of the desired number. Similarly to FIG. 1 it is assumed that the numbers stored in the ROM comprise four bits each which when the number has been read are available in parallel on the parallel output leads 17(.). A number read out is written in a storage element 31. If the number in the element 31 is a multiplier, the bits a(.) of this number are applied through AND gates 18(.) to the shifter. Similarly to the storage element 30 the storage element 31 is constructed so that the contents are overwritten by a subsequently applied number. The address codes for the RAM and the ROM are generated by a control circuit 32.

Here also the control circuit 32 includes a clock pulse generator 19 which delivers clock pulses at a frequency $(m+1)/T$. These clock pulses are applied to a cyclic binary modulo-M+1 counter 33. M of the M + 1 count states of the counter 33 characterize a storage location in the ROM and the successive count states constitute the successive address codes for the ROM. Each of these address codes is applied, with parallel bits, to the ROM, with the result that at the outputs 17(.) of the ROM the number appears which is stored in the storage location characterized by the particular address code.

One of the count states of the counter 33, for example the state which comprises 0 bits only, is used exclusively as a control code for the AND gates 4(.) in the input circuit 1. For this purpose the outputs of the counter 33 are all connected to inputs of a Nand gate 34 which consequently delivers output pulses which occur with a period T. These output pulses set the monostable multivibrator 24 to the metastable state so that the AND gates 4(.) are briefly opened and the AND gates 18(.) are briefly closed, for the output pulses from the multivibrator 24 are applied to these AND gates 18(.) also via an inverter 35 and an AND gate 36. During the said short time a new number $x(nT)$ is written in the RAM at a location indicated by the address code of the RAM. It should be mentioned that just as in the embodiment of FIG. 1 the AND gates 18(.) are controlled by clock pulses from the generator 19 which for this purpose are also applied to the AND gate 36.

In this embodiment the address codes for the RAM 2 are produced by means of a cyclic modulo-N counter 37. This counter 37 is controlled by count pulses $a(c)$ which together with the multipliers are stored in the ROM 16. More particularly the ROM each time simultaneously delivers a multiplier and an instruction pulse $a(c)$ which has the value 1 or 0. This instruction pulse is applied through the output lead 17(3) of the ROM to the storage element 31 and stored therein at the location indicated by $a(c)$. If the command pulse $a(c)$ has the value 1, the state of the counter 37 is changed one step. If $a(c)$ has the value 0, the counter state remains unchanged.

In more detail, at the appearance of each address code characterized by the state of the counter 33 the ROM 16 delivers a 5-bit code word in parallel form. The bits $a(0)$ to $a(2)$ of this code word determine the setting of the shifter, the bit $a(p)$ determines the addition-subtraction setting of the accumulator, and the bit $a(c)$ determines that signal sample $x(nT)$ in the RAM 2 which is to be multiplied by the multiplier characterized by the bits $a(O)$ to $a(p)$.

When a plurality of successive code words $a(c)$, $a(0)$ to $a(p)$ all have an instruction pulse $a(c)$ of value 0, the address code for the RAM 2 remains unchanged. As a result the same signal sample $x(nT)$ is multiplied by the successive multipliers until $a(c)$ has the value 1 again and a new signal sample is stored in the storage element 30.

Table I illustrates the operation of the digital filter described. It is assumed that the number of states of the counter 33 is nine and that the number of filter coefficients is four, that is $c(0)$, $c(1)$, $c(2)$, $c(3)$ which are coded in the multipliers $c(0,1)$, $c(0,2)$; $c(1,2)$, $c(1,3)$; $c(2,1,)$ $c(2,2)$; $c(3,1)$, respectively. The number of storage locations in the RAM here also is four. As is shown in the Table, whenever the state 0000 of the counter 33 occurs a new signal sample is written in the RAM. Because of the occurrence of this state 0000 the instruction bit $a(c)$ has the value 0, the signal sample read from the RAM at the state 1000 of the counter 33 is replaced by this new sample. Immediately after this new sample has been written in the RAM it is multiplied by the multiplier $c(3,1)$ associated with the next state 0001 of the counter 33. Although for simplicity only three states of the counter are cyclically shown, the Table shows that in this manner all the signal samples stored in the RAM are multiplied by all the filter coefficients used.

Figure 3:
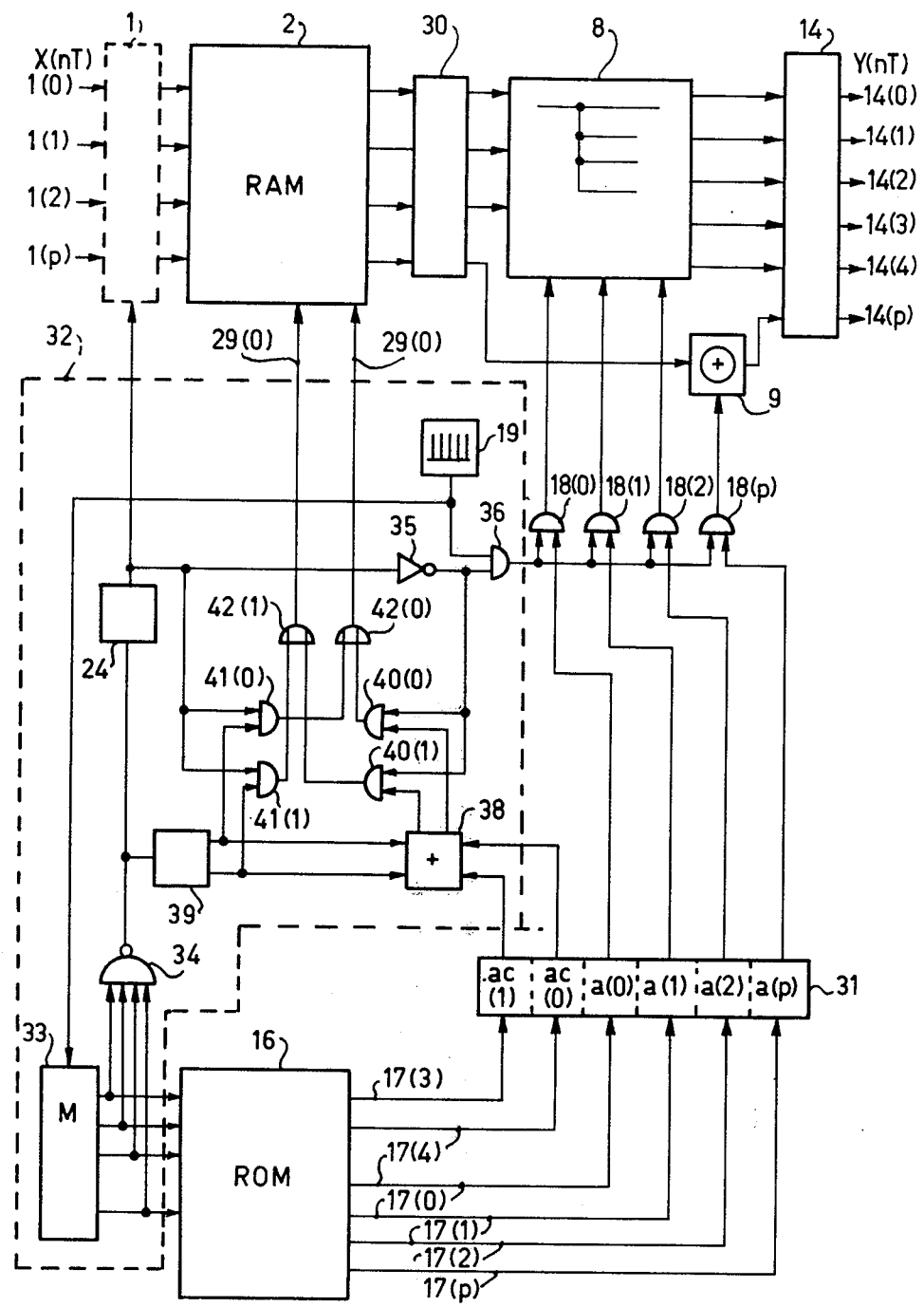

FIG. 3 shows a modified embodiment of the digital filter of FIG. 2. This filter shown in FIG. 3 in its structure largely corresponds to the filter of FIG. 2, and hence in FIG. 3 elements corresponding to those of FIG. 2 are designated by like reference symbols. The filter of FIG. 3 differs from that of FIG. 2 mainly in the structure of the control circuit 32 which is adapted to the choice of the instruction code words. In particular, in this embodiment the ROM 16 delivers instruction code words which each comprise 2 bits $ac(1)$ and $ac(0)$. These instructions bits are stored through separate leads 17(3) and 17(4) in the storage locations of the storage element 31 which are designated by $ac(1)$ and $ac(0)$ respectively. The instruction code word characterizes a given storage location in the RAM 2 and is supplied to a modulo-4 adder 38. To this adder 38 is also supplied a 2-bit number from a cyclic 4-counter 39 which is controlled by the output pulses from the Nand gate 34. Just as in the embodiment of FIG. 2 the gate 34 delivers an output pulse each time the counter 33, which produces 4-bit numbers, delivers four 0 bits. The 2 bits of the number supplied by the adder 38 are applied to AND gates 40(0) and 40(1) respectively, and the 2 bits of the number supplied by the counter 39 are applied to AND gates 41(0) and 41(1) respectively. The outputs of these AND gates 40(.) and 41(.) are connected in the manner shown in the Figure to inputs of OR gates 42(0) and 42(1) the output bits of which together form a code word which is applied as an address code to the address code inputs of the RAM 2. The AND gates 40(.) and 41(.) are controlled by mutually logically inverted signals which are derived from the output and the input respectively of the inverter 35. In this embodiment the four-counter 39 is a downcounter which after the appearance of each pulse at the output of the NOT-AND gate 34 assumes another state and with successive output pulses from the gate 34 delivers the sequence of numbers 00, 11, 10, 01, 00, 11, 10, 01, and so on.

Table II illustrates the operation of the device of FIG. 3. Just as in Table I it is assumed that the counter 33 passes cyclically through nine states and that only four filter coefficients $c(0)$, ..., $c(3)$ are used. In Table II also, the filter coefficients are coded in multipliers which each have a value which is an integral power of two. In Table II the address codes which are supplied by the ROM 16 and consists of the bits $ac(1)$ and $ac(0)$ are represented as decimal numbers, as are the number supplied by the counter 39 and the storage location in the RAM, i.e., the number the bits of which are produced at the outputs of OR gates 42(.).

As Table II shows, in this embodiment also a new number $x(nT)$ is written in the RAM 2 when the counter 33 delivers the number 0000. The location at which this number is written in the RAM is determined here by the state of the counter 39 which before a new number is written in the RAM is set back one step. As a result, the oldest signal sample in the RAM is replaced by the new signal sample. Thus, for example, the number $x[(n-3)T]$ stored in the storage location 3 is replaced by the number $x[(n+1)T]$ and in the next counting cycle of the counter 33 the number $x[(n-2)T]$ is replaced by the number $x[(n+2)T]$. As will be seen from these products, each of the numbers $x(nT)$ is multiplied by all the filter coefficients.

Although in the above embodiment the number of bits of the address code supplied by the ROM is assumed to be two, this number may be extended to any desired value.

In the above embodiments each signal sample stored in the RAM is transferred to the storage element 30 and then multiplied by all the desired multipliers $c(i, k)$. Then the next signal sample is stored in the element 30 and in turn is multiplied by all the desired multipliers. More particularly, in the above embodiments at each given value of the address code for the RAM a number of multipliers is applied to the shifter 8.

The embodiment shown in FIG. 3 permits of realizing the required partial products in another manner which consists in that with a given value of the multiplier all the address codes for the RAM are generated which correspond to those signal samples stored in the RAM which are to be multiplied at least with the given multiplier. The multipliers may be stored in the ROM so that they appear at the ROM output with increasing magnitude, for example in the order 001, 010, 100. By characterizing the required multipliers by a sign bit and only a single "magnitude" bit, the series combination of the shifter 8 and the accumulator 14 can advantageously be replaced by what is generally referred to as a shifting accumulator which after each occurrence of a bit which characterizes a multiplier shifts its contents one place.

Figure 4:
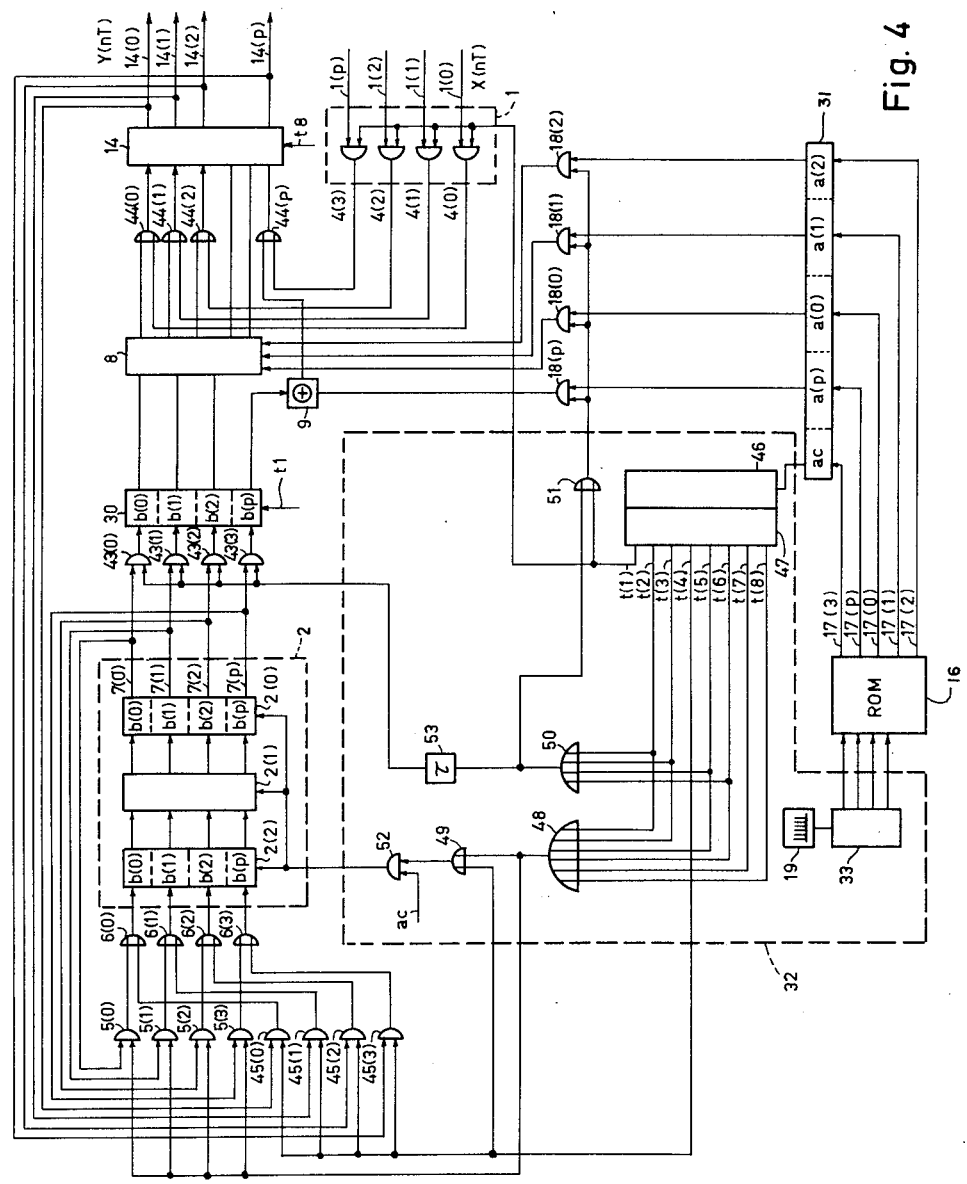
FIG. 4 is a schematic diagram of a recursive digital filter according to the invention.

FIG. 4 shows a digital filter of the recursive type. Elements corresponding to FIG. 1 are designated by like reference symbols in FIG. 4. This embodiment also has an input circuit 1, a looped-around cascade arrangement 2 of storage elements 2(.) each arranged to store and deliver a number comprising four parallel bits. In this embodiment, in which only three storage elements 2(.) are shown, the outputs of the element 2(0) are coupled via AND gates 5(.) and OR gates 6(.) to inputs of the storage element 2(2). The outputs 7(0) to 7(2), 7(p) are each connected through an AND gate 43(.) to an input of the storage element 30, which performs the same function as the element 30 in FIGS. 2 and 3. Unlike the embodiment of FIG. 1, in the device of FIG. 4 the output signals from the AND gates 4(.) in the input circuit 1 are applied to inputs of respective OR gates 44(.). The OR gates 44(0) to 44(2) are connected in the manner shown in the Figure between outputs of the shifter 8 and inputs of the accumulator 14, whilst the OR gate 44(p) is connected between the output of the modulo-2 counter 9 and an input of the accumulator 14. To realize the recursive structure of the filter the outputs 14(.) of the accumulator 14 are connected through AND gates 45(.) to inputs of the OR gates 6(.).

Just as in the embodiment of FIGS. 2 and 3 the storage device for the various filter coefficients is in the form of a ROM 16 which is controlled by the cyclic counter 33 which counts the output pulses from the clock pulse generator 19. Here also the ROM delivers a sequence of multipliers which each are accompanied by an instruction bit a(c (see Table I). This instruction bit is applied via the storage element 31 to a cyclic eight-counter 46. The counter 46 is connected to a decoder network 47 having eight output leads *t*1 to *t*8. The decoder network 47 decodes the counter states in a manner such that at each counter state a pulse is produced on only one of the output leads *t*1 to *t*8. For example, at a counter state 000 a pulse appears on the lead *t*1, at a counter state 001 on the lead *t*2, at a counter state 010 on the lead *t*3, at a counter state 011 on the lead *t*4, and so on. These pulses are applied through OR gates 48, 49, 50, 51, AND gate 52 and a delay device 53 to the AND gates 5(.), to the clock pulse inputs of the storage elements 2(.), to the AND gates 43(.) and to the AND gates 18(.). It should be mentioned that the instruction bits a(c also are applied to the AND gate 52 and that the delay time of the delay element 53 has a value such that a pulse which opens the AND gates 43(.) appears at the output of this element 53 immediately after the contents of the storage elements 2(.) have been shifted. This shift takes place only when the instruction bits a(c have the value 1.

The pulses on the lead *t*1 further are directly applied to the AND gates 4(.) and to the reset input of the storage element 30, whilst the pulses on the lead *t*4 are directly applied to the AND gates 45(.).

Due to the provision of the AND gate 52 the contents of the storage elements 2(.) are shifted after the number stored in the storage element 2(0) and written in the storage element 30 corresponds a plurality of times to the number of multipliers in which the instantenous filter coefficient is coded.

Owing to a pulse on the lead *t*4 the three most significant bits of the number in the accumulator 14 and the associated sign bit are written in the storage element 2(2). As is the case with the number $x(nT)$, it is assumed that the number in the accumulator and the multipliers are given in fixed-point representation i.e., that the bits decreasing in significance represent the values $(½)^1$, $(½)^2$, $(½)^3$ respectively. It should be mentioned that after the contents of the accumulator 14 have been written in the storage element 2(2) the accumulator is not reset.

Under the control of the pulses on the output leads *t*5 and *t*6 multiplications are performed and shift pulses are applied to the storage elements 2(.) again. The pulse which subsequently appears on the output lead *t*7 effects only a shift of the contents of the store 2, whilst the pulse which subsequently appears on the output lead *t*8 causes not only the contents of the store 2 to be shifted but also the accumulator 14 to be read and reset to zero.

Figure 5:
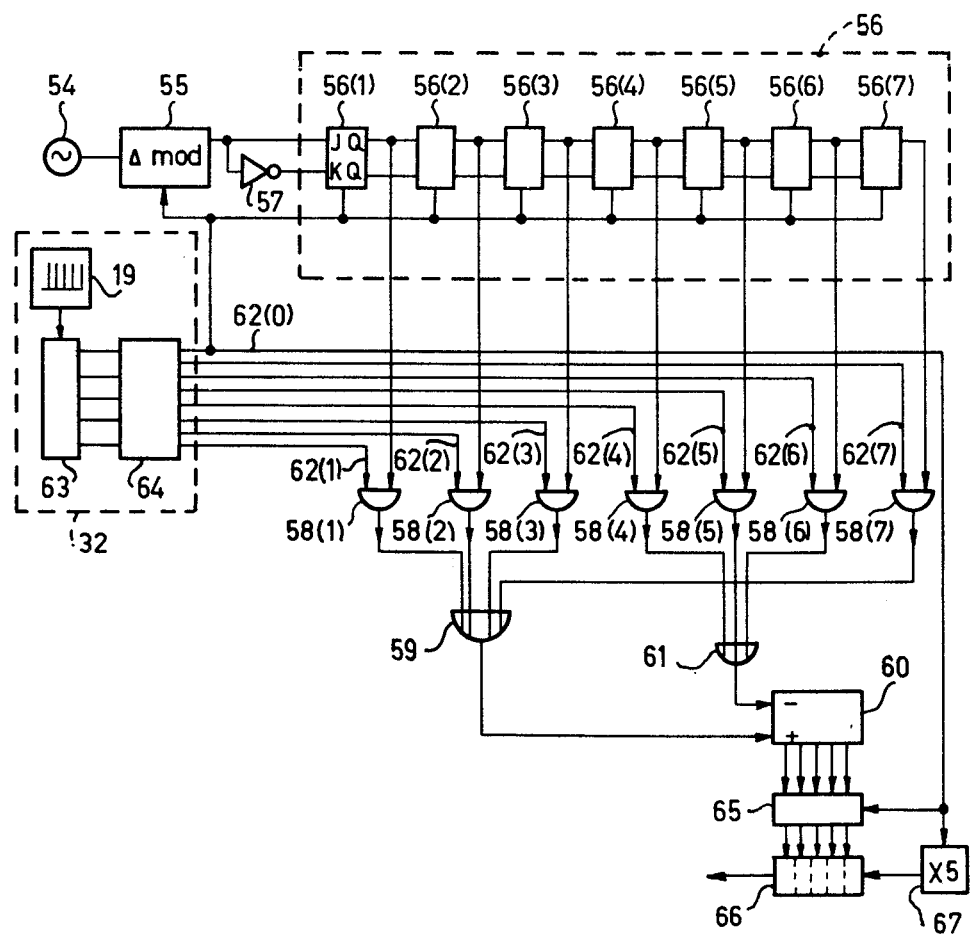
FIGS. 5 and 6 show modifications of the non-recursive digital filter according to the invention for filtering delta-modulated signals.

FIG. 5 shows a modified embodiment of the apparatus according to the invention. In this embodiment the filter coefficients each are equal to a multiple of $2^0$. The embodiment of FIG. 5 is arranged to filter a delta-modulated analog signal, the delta-modulation pulses occurring at a frequency $f_s$ of, for example, 56 kHz. In the embodiment shown the said analog signal is derived from a signal source 54 and applied to a delta modulator 55 the output pulses of which are applied to a shift register 56 comprising a series arrangement of J. K. flip-flops 56(.). More particularly the delta-modulation pulses are directly applied to the J input of the flip-flop 56(1). The contents of this shift register are shifted at the said frequency $f_s$. The Q output of each of the said flip-flops 56(.) is connected to an input of one AND gate of a set of AND gates 58(.) which normally are closed.

In the digital filter shown the filter coefficients by which the delta modulation pulses stored in the flip-flops 56(1), . . ., 56(7) are to be multiplied are +4, +12, +6, −1, −3, −1, +1, respectively. For performing these multiplications the outputs of the AND gates 58(1), 58(2), 58(3), 58(7) are connected via an OR gate 59 to the adding input of a bidirectional counter 60, while the outputs of the AND gates 58(4), 58(5), 58(6) are connected through an OR gate 61 to the down-counting of the counter 60. To the other inputs of the AND gates 58(.) enabling pulses are applied.

The said enabling pulses are generated by a control circuit 32 and applied to the AND gates 58(.) via parallel lines 62(1) to 62(7). For this purpose the conrol circuit here also includes a clock pulse generator 19 which delivers clock pulses at a frequency equal to 29 $f_s$, i.e., at a frequency 29 times the delta-modulation frequency. The clock pulses are applied to a cyclic counter 63 having a period of 29 clock pulses. This counter 63 is connected to a decoding network 64 having eight parallel outputs 62 (0), ..., 62(7). The pulses which appear at the output 62(0) are used as control pulses for the shift register 56. The pulses which appear at the outputs 62(1) to 62(7) are applied to the AND gates 58(.). More particularly a pulse appears at the output 62(0) at the first count state (count state 8) of the cyclic couner 63. At each of the subsequent four states (states Nos 1, 2, 3, 4) a pulse appears at the output 62(1), at each of the next subsequent twelve states (states Nos 5, 6, 7, ..., 16) a pulse appears at the output 62(2), and so on. Thus the number of pulses which appear on one of the lines 62(1) to 62(7) characterize the required filter coefficient, because, for example, the delta-modulation bit stored in the storage element 56(1) is applied four times to the counter 60, the delta-modulation bit stored in the storage element 56(2) is applied to the couner twelveve times, and so on. The contents of the counter can be read after a complete cycle of the counter 63. In the embodiment shown the contents of the counter are written in a shift register 66 via a transfer circuit 65. The transfer circuit 65 may in known manner comprise normally closed AND gates which are enabled by the pulses appearing on the output lines 62(0). After frequency multiplication by a suitably chosen factor (for example a factor of 5) in a frequency multiplier 67 the signal on the output line 62(0) may also be used for serially reading the bits in the shift register 66.

It should be mentioned that in the embodiment under consideration in which a delta-modulated signal is filtered and converted to a sequence of binary code words which each comprise a given number of bits having different weights, the counter 60 is not reset to zero after each cycle of the counter 63.

Although in this embodiment a delta-modulated signal is considered, a PCM signal comprising binary numbers $x(nT)$ also may be written in the store 56. The storage elements 56(.), which in this embodiment each comprise a flip-flop only, then must be adapted in accordance with the preceding embodiments. Also each of the AND gates 58(.) must be extended to comprise a number of AND gates equal to the number of bits per binary number $x(nT)$, and furthermore the bidirectional counter 60 then must be replaced by an accumulator which is reset after each cycle of the counter 63.

Figure 6:
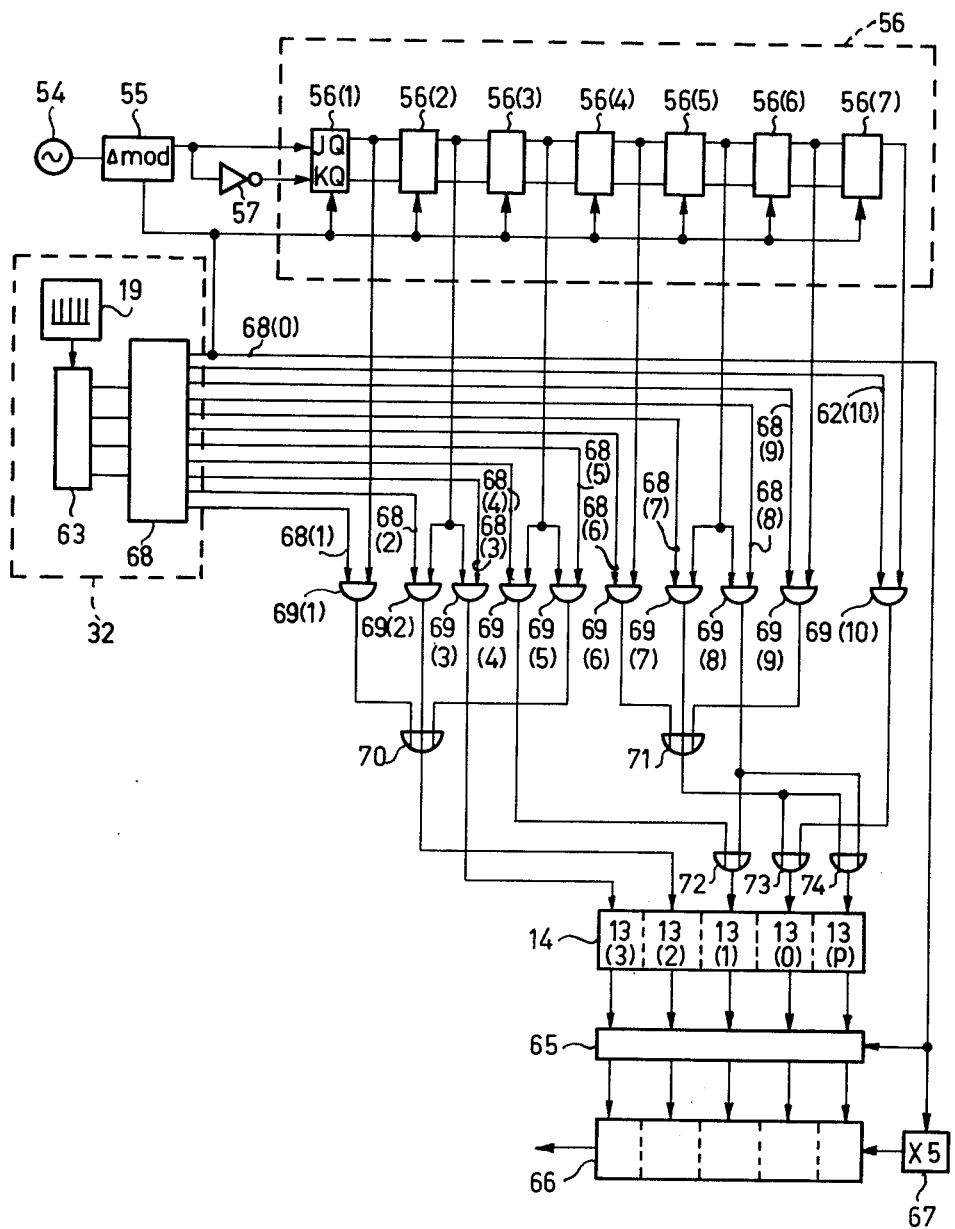

FIG. 6 shows a modification of the embodiment of FIG. 5. In this FIG. 6 the same filter coefficients are used as in FIG. 5, however, these filter coefficients are not coded linearly but divided into a number of multipliers which each comprise an integral power of two, for example $4 = 2^2$, $12 = 2^3 + 2^2$, $6 = 2^1 + 2^2$.

The apparatus of FIG. 6 also is designed for filtering a delta-modulated signal, and hence elements corresponding to those of FIG. 5 are designated by the same reference numerals in FIG. 6. This embodiment differs from that of FIG. 5 mainly in that instead of a bidirectional counter an accumulator 14 is used. This step in conjunction with the aforementioned coding of the filter coefficients results in that the frequency of the clock pulse generator 19 can be appreciably lower than that used in the apparatus of FIG. 5 and may, for example, be $11 f_s$.

In this embodiment the clock pulses are again applied to a cyclic counter 63 having a cycle of eleven clock pulses. A decoding network 68 having eleven outpus 68(.) is connected to the counter. At the first count state (count state No. 0) of the counter cycle a pulse appears on the output line 68(0), at the second state (state No. 1) a pulse appears on the output line 68(1), at the third state (state No. 2) a pulse appears on the output line 68(2), and so on. The pulses which thus appear sequentially on the various output lines 68(.) of the decoding network 68 are applied to first inputs of AND gates 69(.). A second input of each of these AND gates is connected in the manner shown in the Figure each to an output of a storage element 56(.) while the outputs are connected through OR gates 70 to 73 to inputs 13(.) of the accumulator 14. The output of the AND gate 69(8) and the output of the OR gate 71 are additionally connected via a common OR gate 74 to an add-subtract input $13(p)$ of the accumulator. In a manner similar to that used in the devices according to FIGS. 1 to 4 the bits which simultaneously appear at the inputs of the accumulator 14 form a binary number which in this embodiment contains a 1 bit in one position and the sign of which is given by the bit which appears at the input $13(p)$. If this sign bit has the value 0 the number applied is added to the contents of the accumulator. In the same manner as described with respect to the embodiment of FIG. 5 the contents of the accumulator can be read out at a given clock frequency, binary numbers becoming available for transfer or for further processing. In this embodiment also the accumulator is not reset to zero after a cycle of the cyclic counter 63.

Table I

| state of counter 33 | a(c) | filter coefficient | magnitude of multiplier | No. of storage location in RAM |
|---|---|---|---|---|
| 0000 | 0 | — | 000 | 0 |
| 0001 | 0 | c(3) | c(3,1)= 001 | 0 |
| 0010 | 1 | c(2) | c(2,1)= 010 | 1 |
| 0011 | 0 |  | c(2,2)= 001 | 1 |
| 0100 | 1 | c(1) | c(1,1)= 100 | 2 |
| 0101 | 0 |  | c(1,2)= 100 | 2 |
| 0110 | 0 |  | c(1,3)= 010 | 2 |
| 0111 | 1 | c(o) | c(o,1)= 010 | 3 |
| 1000 | 0 |  | c(o,2)= 001 | 3 |
| 0000 | 0 | — | 000 | 3 |
| 0001 | 0 | c(3) | c(3,1) | 3 |
| 0010 | 1 | c(2) | c(2,1) | 0 |
| 0011 | 0 |  | c(2,2) | 0 |
| 0100 | 1 | c(1) | c(1,1) | 1 |
| 0101 | 0 |  | c(1,2) | 1 |
| 0110 | 0 |  | c(1,3) | 1 |
| 0111 | 1 | c(o) | c(0,1) | 2 |
| 1000 | 0 |  | c(o,2) | 2 |
| 0000 | 0 | — | 000 | 2 |
| 0001 | 0 | c(3) | c(3,1) | 2 |
| 0010 | 1 | c(2) | c(2,1) | 3 |
| 0011 | 0 |  | c(2,2) | 3 |
| 0100 | 1 | c(1) | c(1,1) | 0 |
| 0101 | 0 |  | c(1,2) | 0 |
| 0110 | 0 |  | c(1,3) | 0 |
| 0111 | 1 | c(o) | c(o,1) | 1 |
| 1000 | 0 |  | c(o,2) | 1 |

| state of counter 37 | signal sample in element 30 | product |
|---|---|---|
| 00 | x(nT) |  |
| 00 | x(nT) | c(3,1).x(nT) |
| 01 | x (n−1)T | c(2,1).x (n−1)T |
| 01 | x (n−1)T | c(2,2).x (n−1)T |
| 10 | x (n−2)T | c(1,1).x (n−2)T |
| 10 | x (n−2)T | c(1,2).x (n−2)T |
| 10 | x (n−2)T | c(1,3).x (n−2)T |
| 11 | x (n−3)T | c(0,1).x (n−3)T |
| 11 | x (n−3)T | c(o,2).x (n−3)T |
| 11 | x (n+1)T |  |
| 11 | x (n+1)T | c(3,1).x (n+1)T |
| 00 | x(nT) | c(2,1).x(nT) |
| 00 | x(nT) | c(2,2).x(nT) |
| 01 | x (n−1)T | c(1,1).x (n−1)T |
| 01 | x (n−1)T | c(1,2).x (n−1)T |
| 01 | x (n−1)T | c(1,3).x (n−1)T |
| 10 | x (n−2)T | c(0,1).x (n−2)T |
| 10 | x (n−2)T | c(0,2).x (n−2)T |
| 10 | x (n+2)T |  |

Table I-continued

| | | |
|---|---|---|
| 10 | x (n+2)T | c(3,1).x (n+2)T |
| 11 | x (n+1)T | c(2,1).x (n+1)T |
| 11 | x (n+1)T | c(2,2).x (n+1)T |
| 00 | x(nT) | c(1,1).x(nT) |
| 00 | x(nT) | c(1,2).x(nT) |
| 00 | x(nT) | c(1,3).x(nT) |
| 01 | x (n−1)T | c(o,1).x (n−1)T |
| 01 | x (n−1)T | c(o,2).x (n−1)T |

Table II

| state of counter 33 | address code ac | state of counter 39 | filter coefficient | multiplier |
|---|---|---|---|---|
| 0000 | 0 | 0 | — | — |
| 0001 | 0 | 0 | c(3) | c(3,1) |
| 0010 | 1 | 0 | c(2) | c(2,1) |
| 0011 | 1 | 0 | | c(2,2) |
| 0100 | 2 | 0 | c(1) | c(1,1) |
| 0101 | 2 | 0 | | c(1,2) |
| 0110 | 2 | 0 | | c(1,3) |
| 0111 | 0 | 0 | c(o) | c(o,1) |
| 1000 | 3 | 0 | | c(o,2) |
| 0000 | 0 | 3 | — | — |
| 001 | 0 | 3 | c(3) | c(3,1) |
| 0010 | 1 | 3 | c(2) | c(2,1) |
| 0011 | 1 | 3 | | c(2,2) |
| 0100 | 2 | 3 | c(1) | c(1,1) |
| 0101 | 2 | 3 | | c(1,2) |
| 0110 | 2 | 3 | | c(1,3) |
| 0111 | 3 | 3 | c(o) | c(o,1) |
| 1000 | 3 | 3 | | c(o,2) |
| 000 | 0 | 2 | — | — |
| 001 | 0 | 2 | c(3) | c(3,1) |
| 0010 | 1 | 2 | c(2) | c(2,1) |
| 0011 | 1 | 2 | | c(2,2) |
| 0100 | 2 | 2 | c(1) | c(1,1) |
| 0101 | 2 | 2 | | c(1,2) |
| 0110 | 2 | 2 | | c(1,3) |
| 0111 | 3 | 2 | c(o) | c(o,1) |
| 1000 | 3 | 2 | | c(0,2) |

| No. of storage location in the RAM | signal sample in clement 30 | product |
|---|---|---|
| 0 | x(nT) | |
| 0 | x(nT) | c(3,1).x(nT) |
| 1 | x (n−1)T | c(2,1).x (n−1)T |
| 1 | x (n−1)T | c(2,2).x (n−1)T |
| 2 | x (n−2)T | c(1,1).x (n−2)T |
| 2 | x (n−2)T | c(1,2).x (n−2)T |
| 2 | x (n−2)T | c(1,2).x (n−2)T |
| 3 | x (n−3)T | c(o,1).x (n−3)T |
| 3 | x (n−3)T | c(o,2).x (n−3)T |
| 3 | x (n+1)T | |
| 3 | x (n+1)T | c(3,1).x (n+1)T |
| 0 | x(nT) | c(2,1).x(nT) |
| 0 | x(nT) | c(2,2).x(nT) |
| 1 | x (n−1)T | c(1,1).x (n−1)T |
| 1 | x (n−1)T | c(1,2).x (n−1)T |
| 1 | x (n−1)T | c(1,3).x (n−1)T |
| 2 | x (n−2)T | c(o,1).x (n−2)T |
| 2 | x (n−2)T | c(o,2).x (n−2)T |
| 2 | x (n+2)T | |
| 2 | x (n+2)T | c(3,1).x (n+2)T |
| 3 | x (n+1)T | c(2,1).x (n+1)T |
| 3 | x (n+1)T | c(2,2).x (n+1)T |
| 0 | x(nT) | c(1,1).x(nT) |
| 0 | x(nT) | c(1,2).x(nT) |
| 0 | x(nT) | c(1,3).x(nT) |
| 1 | x (n−1)T | c(o,1).x (n−1)T |
| 1 | x (n−1)T | c(o,2).x (n−1)T |

What is claimed is:

1. A digital filter comprising
   input means for supplying a sequence of input signals with a predetermined input sampling frequency;
   storage means, connected to said input means for storing a pedetermined number of successive input signals, and having an output;
   multiplying means for multiplying the signals stored in said storage means by weighting factors to produce a product signal; and
   control means, connected to said storage means and said multiplying means, for supplying one of said input signals stored in said storage means a predetermined number of times to said multiplying means for multiplication with corresponding multipliers associated with one of said weighting factors.

2. The digital filter as defined in claim 1, further comprising
   adding means connected to said multiplying means for computing an output signal with a predetermined output sampling frequency, said output signal being the mathematical sum of product signals computed by said multiplying means;
   said control means supplying said one input signal said predetermined number of times within a sampling period determined by said output sampling frequency.

3. The digital filter as defined in claim 1, wherein said multipliers have a value equal to $2^n$, where $n$ is an integer.

4. The digital filter as defined in claim 3, wherein said control means includes a first source for providing a periodic instruction signal, each period of which is formed by a sequence of binary code words which each contain at least one bit, predetermined code words occurring within said period of the instruction signal at relative time intervals adjusted independently of one another, so that whenever said predetermined code words occur another signal sample is processed in said multiplying device.

5. The digital filter as defined in claim 4, further comprising a second source for providing said multipliers, means for supplying to said multiplying means a predetermined number of sequentially occurring multipliers from said second source within said relative time interval of said predetermined instruction code words, for the purpose of multiplication of a signal sample supplied to said multiplying means.

6. The digital filter as defined in claim 5, further comprising a third source for providing said multipliers, and delivering said multipliers at relative time intervals adjusted independently of one another;
   said control means being designed to supply, within each adjusted time interval, to the multiplying means a given number of predetermined signal samples for the purpose of multiplication of these signal samples by the last multiplier provided by said third source.

7. The digital filter device as defined in claim 6, wherein said multiplying means includes an accumulator and a radix point translation device, by means of which said signal samples are supplied to said accumulator for translating the radix point of said signal sample a predetermined number of positions equal to the exponent n of the relevant multiplier, which translation characterizes a multiplication of this signal sample by the relevant multiplier.

8. The digital filter device as defined in claim 7, wherein said radix point translation device is controlled by said predetermined code words.

9. The digital filter device as defined in claim 7, wherein said radis point translation device is controlled by said multipliers.

10. The digital filter device as claimed in claim 7, wherein said multiplying means includes an accumulator, comprising a shifting accumulator, the contents of said shifting accumulator being shifted one position under the control of a multiplier from said third source, the successive ones of said multipliers differing in magnitude by a factor of two.

* * * * *

UNITED STATES PATENT AND TRADEMARK OFFICE
CERTIFICATE OF CORRECTION

PATENT NO. : 3,988,606
DATED : October 26, 1976
INVENTOR(S) : LUDWIG D.J. EGGERMONT It is certified that error appears in the above-identified patent and that said Letters Patent are hereby corrected as shown below:

```
Column  1, line 66, "isalso" should be --is also--

Column  3, line 43, "1" should be --"1"--

Column  4, line 63, "1" should be --"1"--
           line 65, "1" should be --"1"--

Column  5, line 24, "1" should be --"1"--
           line 27, "0" should be --"0"--
           line 51, "1" should be --"1"--

Column  6, line 19, "1" should be --"1"--
           line 22, "0" should be --"0"--
           line 33, "1" should be --"1"--
           line 55, "1" should be --"1"--

Column  7, line 21, "1" should be --"1"--
           line 26, "0" should be --"0"--
           line 28, "0" should be --"0"--
           line 31, "0" should be --"0"--
           line 43, "01000 (=-2¹)" should be
                    -- -01000 (=-2¹) --

Column  8, line 26, "0" should be --"0"--
           line 57, "1" should be --"1"--
```

UNITED STATES PATENT OFFICE
CERTIFICATE OF CORRECTION

Patent No. 3,988,606     Dated October 26, 1976

Inventor(s) Ludwig D.J. Eggermont

It is certified that error appears in the above-identified patent and that said Letters Patent are hereby corrected as shown below:

Column 10, line 61, "0" should be --"0"--

Column 11, line 17, "1 or 0" should be --"1" or "0"--
          line 21, "1" should be --"1"--
          line 22, "0" should be --"0"--
          line 34, "0" should be --"0"--
          line 37, "1" should be --"1"--
          line 49, "Because of" should be --Because at--
          line 50, "0" should be --"0"--

Column 12, line 12, "0" should be --"0"--

Column 13, line 49, "a(c" should be --a(c)--
          line 64, "a(c" should be --a(c)--

Column 14, line 2, "a(c" should be --a(c)--
          line 2, "1" should be --"1"--
          line 63, "conrol" should be --control--

Column 15, line 8, "couner" should be --counter--
          line 18, "couner" should be --counter--
          line 66, "outpus" should be --outputs--

UNITED STATES PATENT OFFICE
CERTIFICATE OF CORRECTION

Patent No. 3,988,606        Dated October 26, 1976

Inventor(s) Ludwig D.J. Eggermont

It is certified that error appears in the above-identified patent and that said Letters Patent are hereby corrected as shown below:

Column 16, line 18, "1" should be --"1"--
            line 21, "0" should be --"0"--

Table I, Column 16, line 68, "c(0,2)" should be --c(o,2)--

Table II, Column 17, line 22, "001" should be --0001--
                             line 27, "000" should be --0000--
                             line 28, "001" should be --0001--

Signed and Sealed this

Seventh Day of June 1977

[SEAL]

Attest:

RUTH C. MASON
*Attesting Officer*

C. MARSHALL DANN
*Commissioner of Patents and Trademarks*